(12) United States Patent
Chen

(10) Patent No.: US 7,521,372 B2
(45) Date of Patent: Apr. 21, 2009

(54) METHOD OF FABRICATION OF PHASE-CHANGE MEMORY

(75) Inventor: Frederick T Chen, Hsinchu County (TW)

(73) Assignees: Industrial Technology Research Institute, Hsinchu (TW); Powerchip Semiconductor Corp., Hsin-Chu (TW); Nanya Technology Corporation, Taoyuan (TW); ProMOS Technologies Inc., Hsinchu (TW); Winbond Electronics Corp., Hsinchu (TW)

( * ) Notice: Subject to any disclaimer, the term of this patent is extended or adjusted under 35 U.S.C. 154(b) by 174 days.

(21) Appl. No.: 11/617,977

(22) Filed: Dec. 29, 2006

(65) Prior Publication Data

US 2008/0157050 A1 Jul. 3, 2008

(51) Int. Cl.
*H01L 45/00* (2006.01)

(52) U.S. Cl. .............................. 438/734; 257/5; 257/3; 257/E45.002

(58) Field of Classification Search ................. 257/2, 257/3, 4, 5, 295, 379, E27.104, E29.17, E45.002, 257/E21.208, 214, 530; 438/95, 900, 103, 438/467, 600; 365/148, 163
See application file for complete search history.

(56) References Cited

U.S. PATENT DOCUMENTS

| | | | |
|---|---|---|---|
| 5,789,758 A | 8/1998 | Reinberg | |
| 6,943,395 B2 | 9/2005 | Oh et al. | |
| 7,034,332 B2 | 4/2006 | Stasiak | |
| 2007/0020934 A1* | 1/2007 | Gaidis et al. | 438/689 |
| 2007/0138595 A1* | 6/2007 | Hsu et al. | 257/536 |

* cited by examiner

*Primary Examiner*—Matthew C Landau
*Assistant Examiner*—Shweta Mulcare
(74) *Attorney, Agent, or Firm*—Quintero Law Office

(57) ABSTRACT

A phase-change memory and fabrication method thereof. The phase-change memory comprises a transistor, and a phase-change material layer. In particular, the phase-change material layer is directly in contact with one electrical terminal of the transistor. Particularly, the transistor can be a field effect transistor or a bipolar junction transistor.

16 Claims, 12 Drawing Sheets

METHOD OF FABRICATION OF PHASE-CHANGE MEMORY

BACKGROUND OF THE INVENTION

1. Field of the Invention

The invention relates to a memory element, and more particularly to a phase-change memory element.

2. Description of the Related Art

Most electronic equipment uses different types of memories, such as DRAM, SRAM and flash memory or a combination of these memories based on the requirements of the application, the operating speed, the memory size and the cost considerations of the equipment. The current developments in the memory technology field include FeRAM, MRAM and phase-change memory. Among these alternative memories, phase-change memory will be the most likely to be mass manufactured in the near future.

Phase-change memory is targeted for applications currently utilizing flash non-volatile memory. Such applications are typically mobile devices which require low power consumption, and hence, minimal programming currents. A phase-change memory cell should be designed with several goals in mind: low programming current, higher reliability (including electromigiation risk), smaller cell size, and faster phase transformation speed. These requirements often set contradictory requirements on feature size, but a careful choice and alignment of materials used for the components can often widen the tolerance.

In order to reduce the programming current, the most straightforward way is to shrink the heating area. A benefit of this strategy is simultaneous reduction of cell size. Assuming a fixed required current density, the current will shrink in proportion to the area. In reality, however, cooling becomes significant for smaller structures, and loss to surroundings becomes more important due to increasing surface/volume ratio. As a result, the required current density must increase as heating area shrinks. This poses an electromigration concern for reliability. Hence, it is important to use materials in the cell which do not pose an electromigration concern. It is also important to improve the heating efficiency, by increasing heating flux in the active programming region while reducing heat loss to the surroundings.

The requirements above are best served by sandwiching the heating region between two regions of phase-change material, preferably the chalcogenide $Ge_2Sb_2Te_5$ (GST). The thermal conductivity of this material is notably low, ~0.2-0.3 W/m-K, due to the 20% presence of vacancies in the crystalline (fcc phase) microstructure. Heating is confined to a small area between a bottom and top portion of the chalcogenide material. A key aspect of this invention is the method of forming such a small area. The bottom portion is contained within a trench formed over the drain in one dimension, and the drain width in the other dimension. The top portion is an extended chalcogenide line perpendicularly oriented with respect to the trench formed over the drain. Preferably, this line is parallel to, of equal width to, and directly under the metal bit-line used to access the memory cell.

U.S. Pat. No. 5,789,758 assigned to Micron ("Chalcogenide Memory Cell with a Plurality of Chalcogenide Electrodes") utilizes a pore in a dielectric layer positioned between an upper and lower chalcogenide electrode, both of which have greater cross-sectional areas than the pore. Formation of the pore in a dielectric layer is a very difficult task to do, and filling it with chalcogenide is even harder. Alternatively, formation of a chalcogenide island to be covered with dielectric is also difficult. Generally, three lithographic steps are needed to form this chalcogenide structure. It is desirable to minimize the number of lithographic steps to manufacture the device.

U.S. Pat. No. 7,034,332 assigned to HP ("Nanometer-Scale Memory Device Utilizing Self-Aligned Rectifying Elements and Method of Making") utilizes rectifying elements disposed between a set of first electrodes and a set of second electrodes. In this case, it is difficult to form the rectifying element due to lithographic difficulty.

In order that fabrication process not be complicated, a phase-change memory element with a minimal number of process steps is called for.

BRIEF SUMMARY OF THE INVENTION

An exemplary embodiment a phase-change memory element comprises a transistor, and a phase-change material layer. Particularly, the phase-change material layer is directly in contact with one terminal of the transistor. In an embodiment of the invention, the transistor comprises a field effect transistor comprising a drain electrode, a source electrode, and a gate electrode, and the phase-change material layer is directly in contact with the drain or source electrode of the field effect transistor. In another embodiment of the invention, the transistor comprises a bipolar junction transistor comprising an emitter electrode, a collector electrode, and a base electrode, and the phase-change material layer is directly in contact with the emitter or collector electrode of the bipolar junction transistor.

Methods of manufacturing phase-change memory element are also provided. An exemplary embodiment of a method comprises the following steps. A substrate with a transistor formed thereon is provided. A dielectric layer is formed on the substrate. A trench passing through the dielectric layer is formed, exposing one terminal of the transistor. A phase-change material layer is formed on the dielectric layer and completely fills the trench. A conductive layer is formed on the phase-change material layer. A patterned hardmask layer with first width is formed on the conductive layer, wherein the patterned hardmask layer is perpendicular to the trench. The phase-change material layer and the conductive layer are etched using the patterned hardmask layer with first width as mask. The patterned hardmask layer is trimmed until a second width of the patterned hardmask layer is achieved, obtaining a tapered profile hardmask layer/conductive layer/phase-change material layer stack, with a bottom phase-change material pedestal. The tapered profile hardmask layers/conductive layer/phase-change material layer stack is then etched using the patterned hardmask layer with the second width as mask, obtaining a straight profile hardmask layer/conductive layer/phase-change material layer stack with the bottom phase-change material pedestal. Particularly, the transistor can be a field effect transistor or a bipolar junction transistor, wherein the field effect transistor comprises a drain electrode, a source electrode, and a gate electrode, and the bipolar junction transistor comprises an emitter electrode, a collector electrode, and a base electrode. Therefore, the trench exposes the drain or source electrode of the field effect transistor. Alternatively, the trench exposes the emitter or collector electrode of the bipolar junction transistor.

According to another embodiment of the invention, the method of manufacturing phase-change memory element comprises forming a patterned hardmask layer with first width on a phase-change material layer. The phase-change material layer is etched using the patterned hardmask layer with first width as mask. The patterned hardmask layer is trimmed until a second width of the patterned hardmask layer is achieved, obtaining a tapered profile hardmask layer/phase-change material layer stack with a bottom phase-change material pedestal. The tapered profile hardmask layer/phase-change material layer stack is etched using the patterned hardmask layer with the second width as mask, obtaining a straight profile hardmask layer/phase-change material layer stack with the bottom phase-change material pedestal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a memory cell comprising a heated phase-change element. Heating takes place at the intersection of phase-change regions. The heating area is defined by a trench on top of the driving transistor drain, along with the width of a chalcogenide line oriented perpendicularly to said trench. The structure allows for simplification of photolithographic patterning as the critical phase-change layers can be defined as line patterns rather than area patterns.

Figure 1A:
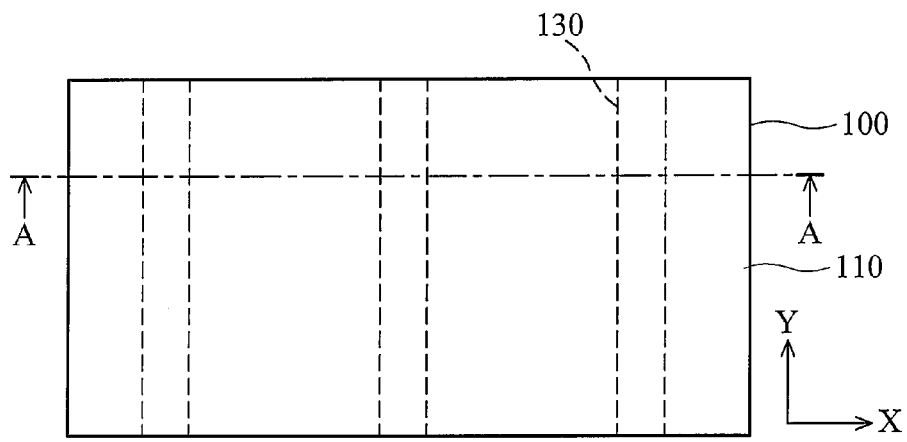
FIGS. 1a-1g are top view of showing a method of fabricating a phase-change memory element according to an embodiment of the invention.
Figure 2A:
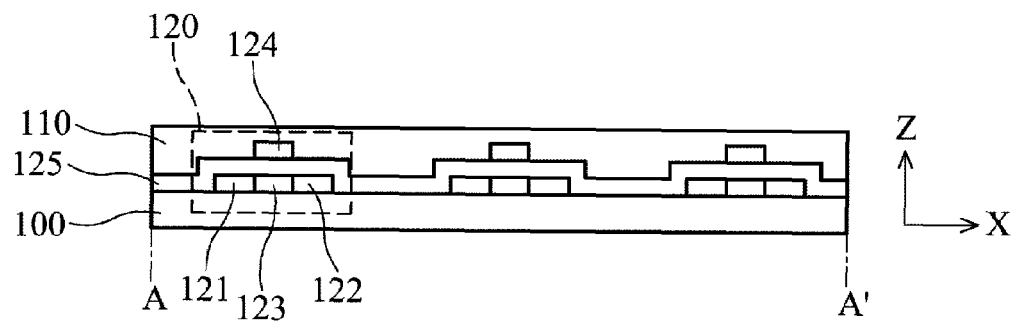
FIGS. 2a-2e are cross sections are sectional diagrams of FIGS. 1a-1g along line A-A'.

The manufacturing process of the phase-change memory element of an embodiment of the invention is disclosed below. First, referring to FIG. 1a showing a schematic top view, a substrate 100 with a first dielectric layer 110 formed completely thereon is provided. FIG. 2a is a sectional diagram along line A-A' of FIG. 1a. Referring to FIG. 2a, there are a plurality of transistors 120 formed on the substrate 100, wherein the transistors 120 at least comprises a source electrode 121, a drain electrode 122, a channel 123, a gate electrode 124, and a gate insulator 125. The choices for the transistor 120 are unlimited, and can be amorphous-silicon thin film transistor, low temperature poly-silicon thin film transistor (LTPS-TFT), or organic thin film transistor (OTFT). Alternatively, bipolar junction transistors may be used. The structure of the field effect transistor is illustrated as an example, but not intended to be limitative of the invention. In FIG. 1a, there is a plurality of word line gates 130 comprising gate electrodes 124 extending along a Y direction.

Figure 1B:
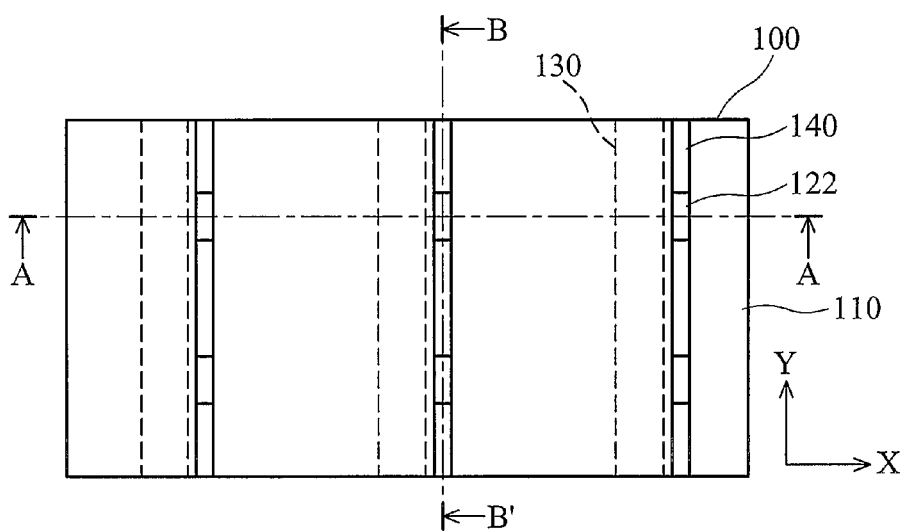
Figure 2B:
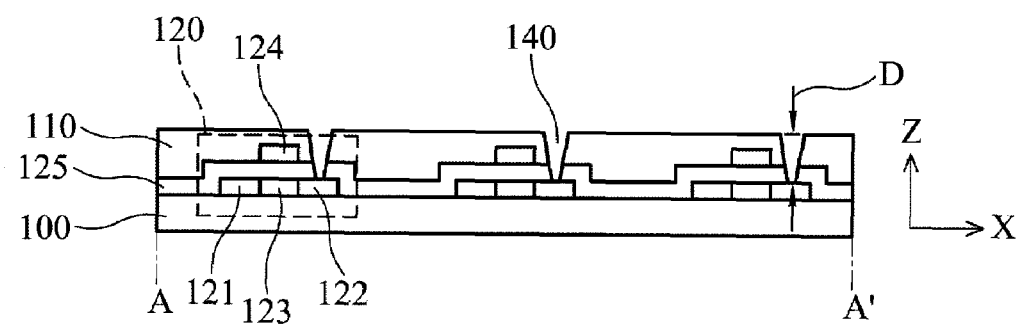
Figure 3A:
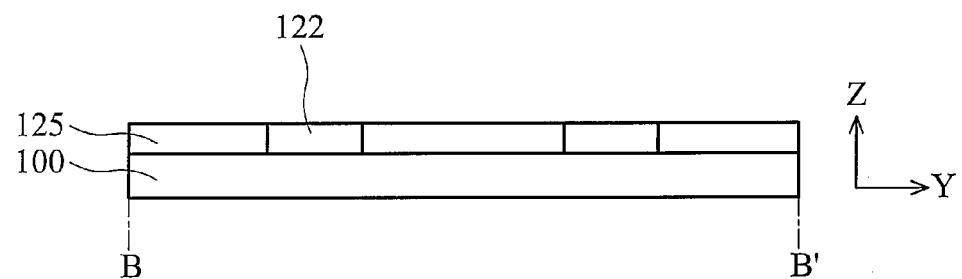
FIGS. 3a-3g are cross sections are sectional diagrams of FIGS. 1a-1g along line B-B'.
Figure 4:
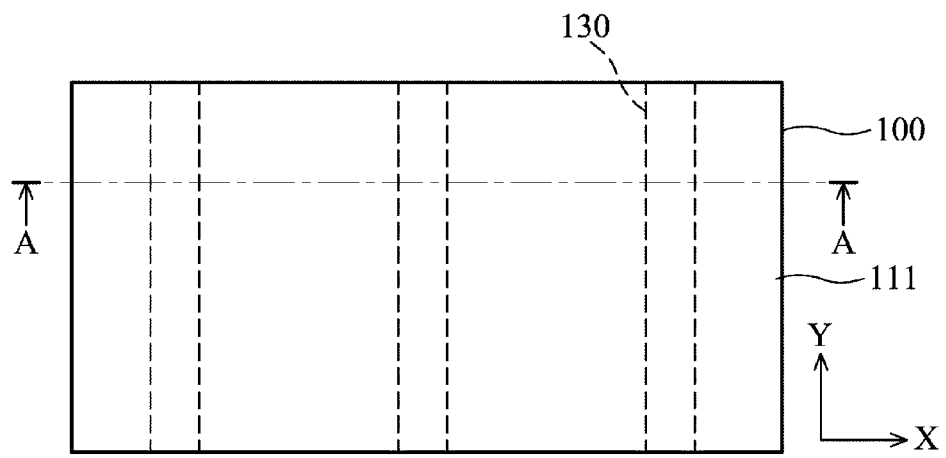
FIG. 4 is a top view of showing a protective layer formed on the dielectric layer in an embodiment of the invention.
Figure 5:
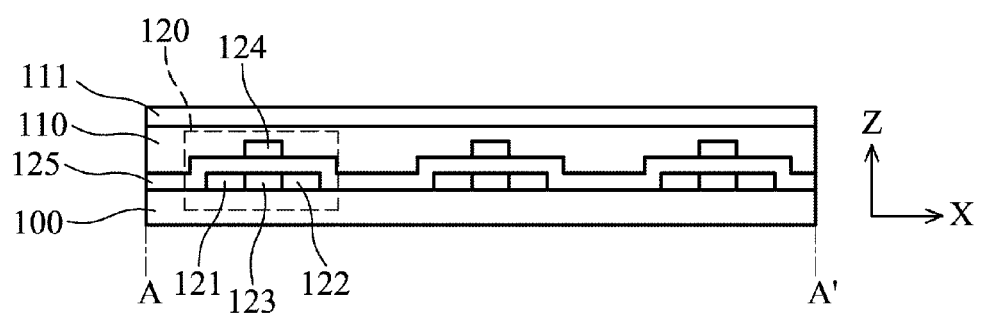
FIG. 5 is a cross section of FIG. 4 along line A-A'.

In an embodiment of the invention, referring to FIGS. 4 and 5, an oxide protective layer 111 preferably at least 20 nm thick is applied over a planarized surface with the formed structures underneath for the purpose of protection from subsequent processing. Next, referring to FIGS. 1b and 2b, a trench 140 is formed over the drain electrode 122 by etching the first dielectric layer 110 and the gate insulator 125 with a patterned photoresist as mask. Herein, the trenches 140 extend along the Y direction parallel to the gate lines 130, and pass through the first dielectric layer 110 and the gate insulator 125 over the drain electrode 122 exposing the top surface of the drain electrode 122, referring to FIG. 3a showing a sectional diagram along line B-B' of FIG. 1b. The trench can has a depth D between 20~150 nm, preferably 100 nm. It should be noted that the patterning of narrow trench 140 is easier than the patterning of a small contact hole used in the conventional fabricating method, since the normalized image log slope is better. It can be improved ever more so by use of a negative photoresist, where a larger exposed feature leads to narrower trench.

Figure 1C:
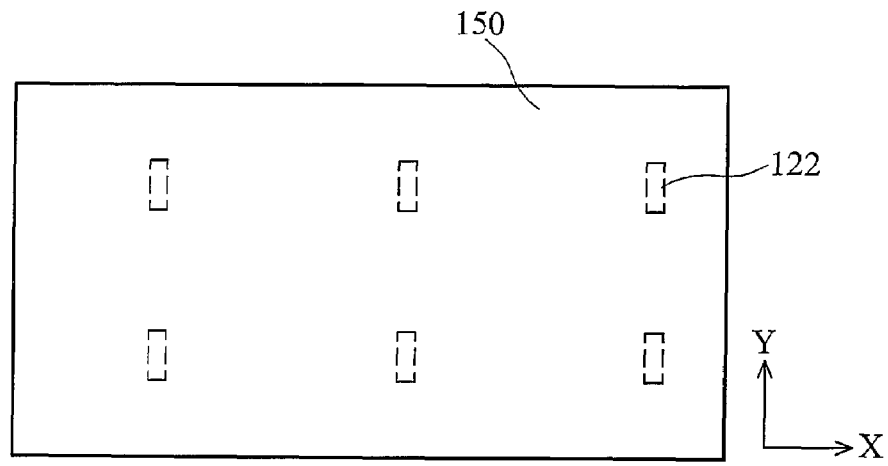
Figure 2C:
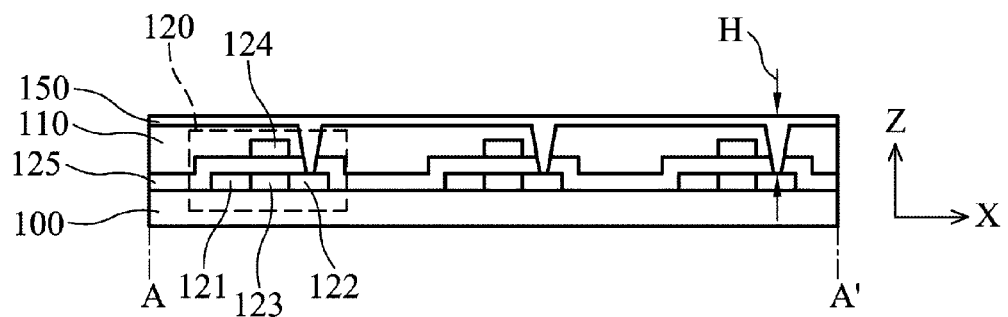

Next, referring to FIG. 1c, a phase-change material layer 150 is deposited on the substrate 100 so as to completely fill the trench 140. Specifically, referring to FIG. 2c, the phase-change material layer 150 over the drain electrode 122 has a height H larger than the depth D of the trench 140. The difference between the height H and the depth D is 10~100 nm, preferably 50 nm. The phase-change layer can comprise In, Ge, Sb, Te or combinations thereof, such as GeSbTe or InGeSbTe.

Figure 1D:
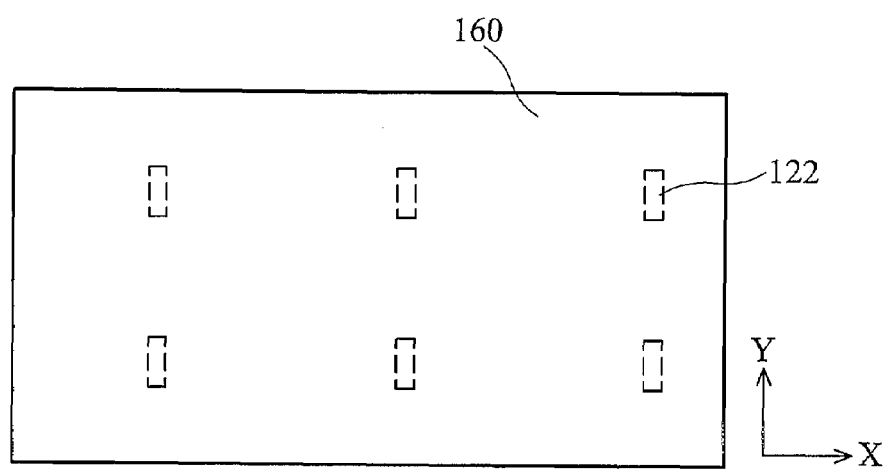
Figure 2D:
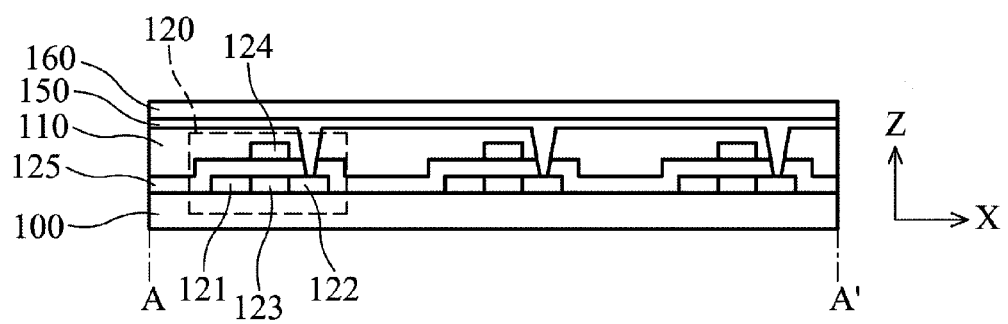
Figure 3B:
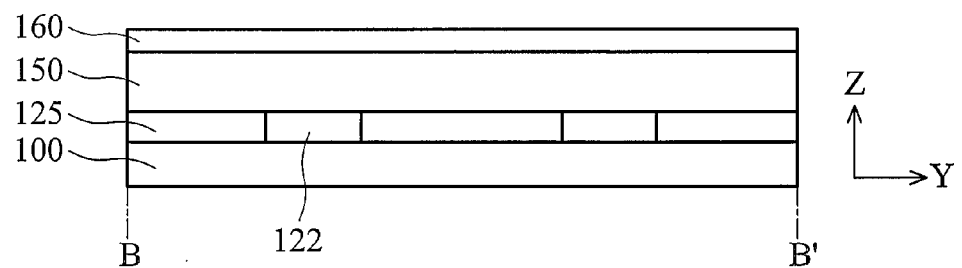

Next, referring to FIGS. 1d, 2d and 3b, a conductive layer 160 is formed ob the phase-change material layer 150. Suitable material of the conductive layer 160 can be TaN, W, TiN, or TiW.

Figure 1E:
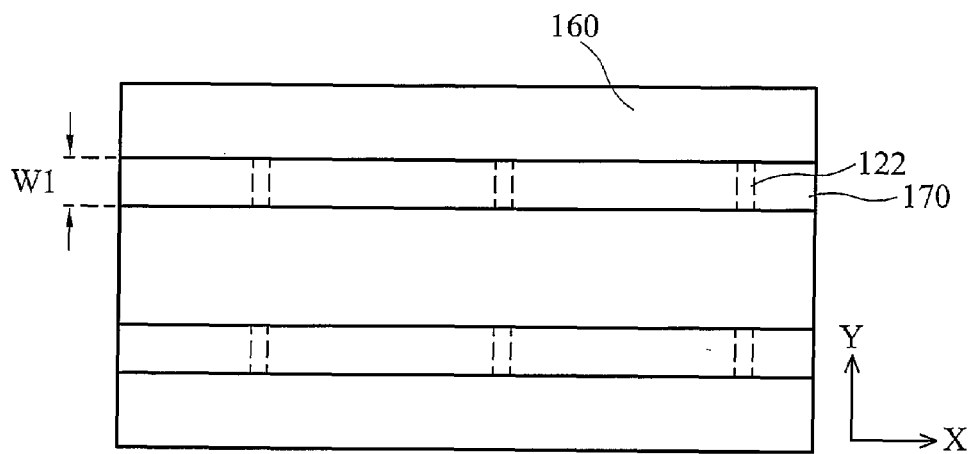
Figure 2E:
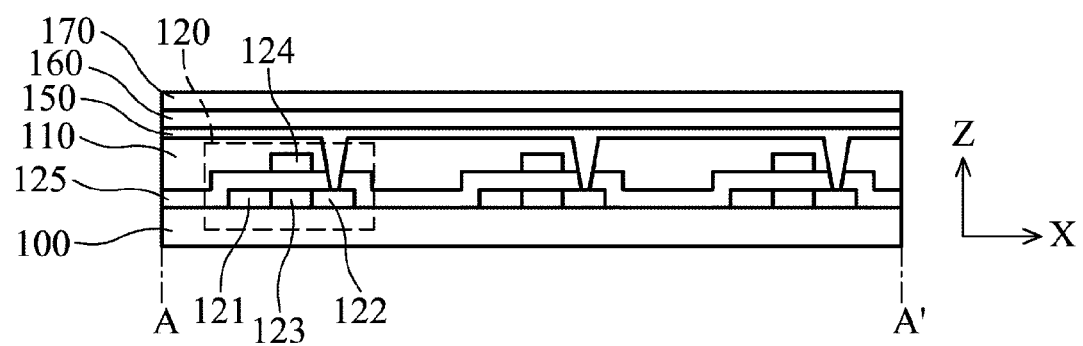
Figure 3C:
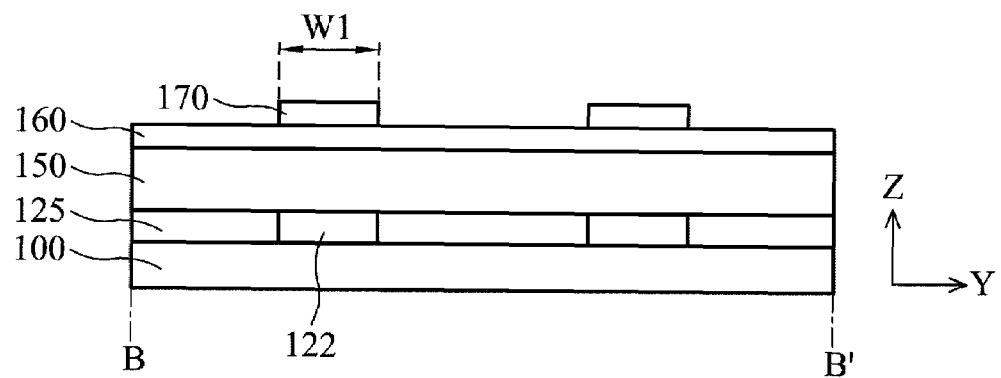

Next, referring to FIGS. 1e, 2e, and 3c, a plurality of patterned hardmask layers 170 is formed on the conductive layer 160 over the source and drain electrode 121 and 122 of the transistor 120. Particularly, the patterned hardmask layers 170 are perpendicular to the gate lines 130 and the trenches 140, and has a width W1 greater than the width of the thin film transistor 120 (the width of the source and drain electrodes 121 and 122). The patterned hardmask layers 170 can be an oxide or oxynitride layer and formed by PECVD.

Figure 1F:
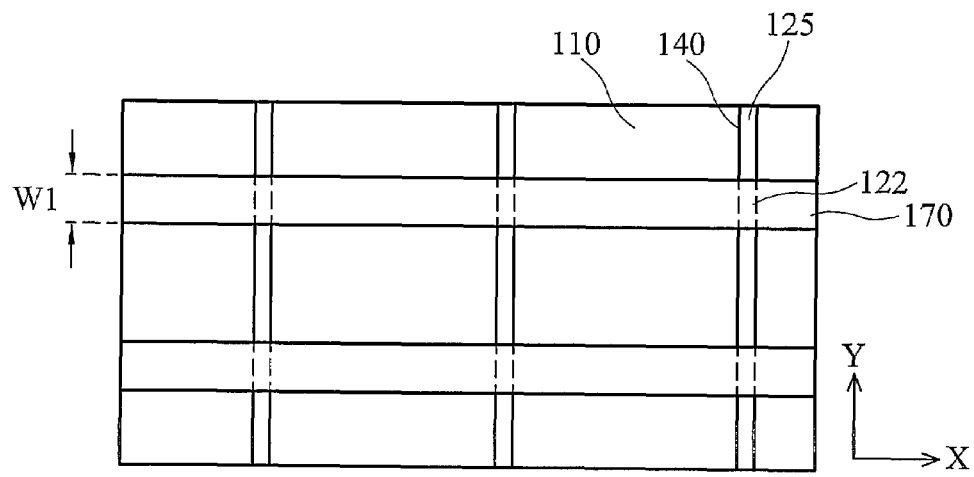
Figure 3D:
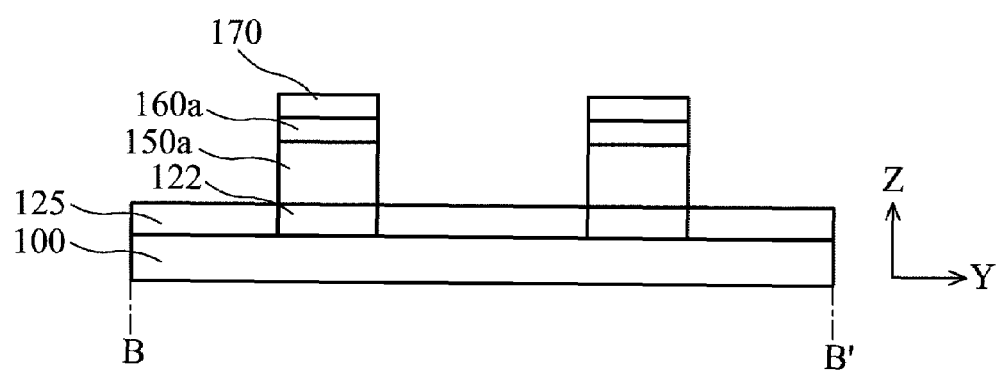

Next, referring to FIGS. 1f and 3d, the phase-change material layer 150 and the conductive layer 160 is etched with the patterned hardmask layers 170 as mask and the first dielectric layer 110 and the gate insulator 125 acting as an etch stop. After etching, the patterned phase-change material layer 150a and the conductive layer 160a with the width W1 is obtained. Herein, a chlorine-base etch (preferably Ar/Cl2) is then used to etch through the phase-change material layer 150 and the conductive layer 160 without etching the patterned hardmask layers 170 appreciably. The etching until all the phase-change material layer 150 is removed outside the patterned hardmask layers 170 (outside the thin film transistors 120).

Figure 3E:
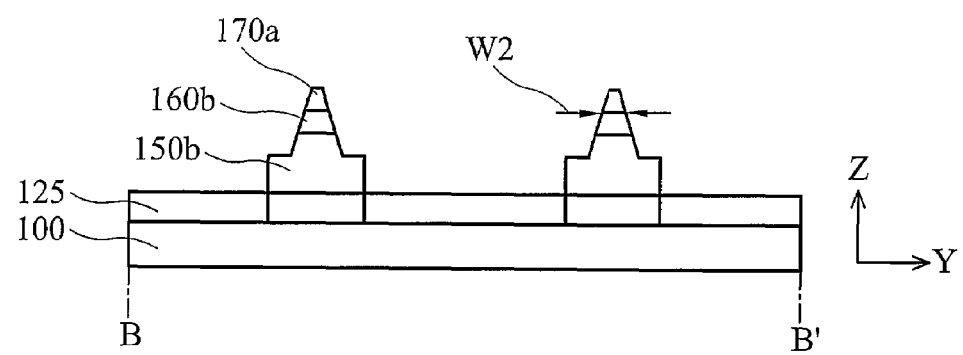

Next, referring to FIG. 3e, a trimming process is performed to the patterned hardmask layers 170, as well as the underlying exposed the patterned phase-change material layer 150a and the conductive layer 160a. Specifically, the hardmask layer 170 is trimmed by etching with fluorine-rich etchant until the desired final width W2 is achieved. The results is a tapered profile hardmask layers 170a/conductive layer 160b/phase-change material layer 150b stack on top with a wider bottom phase-change material pedestal.

Figure 1G:
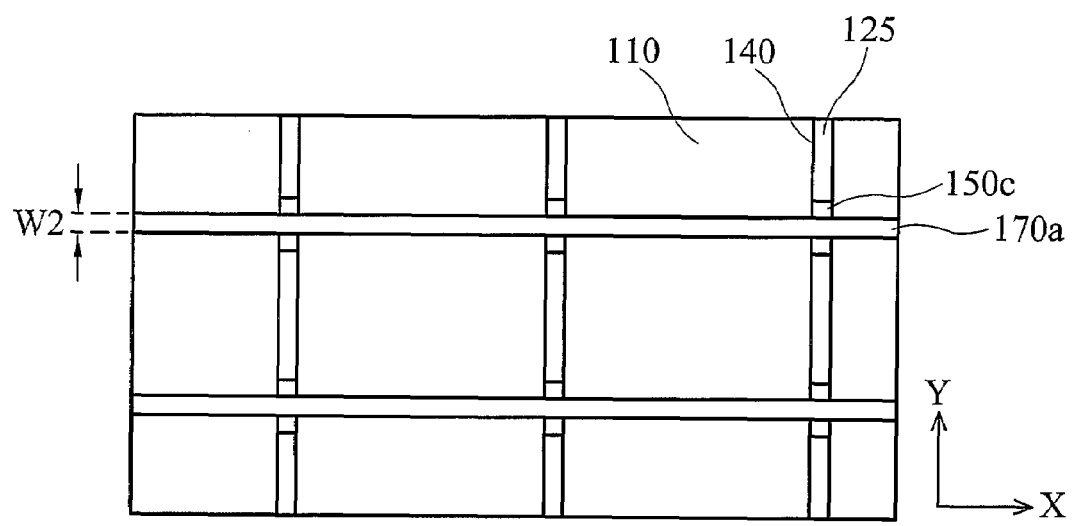
Figure 3F:
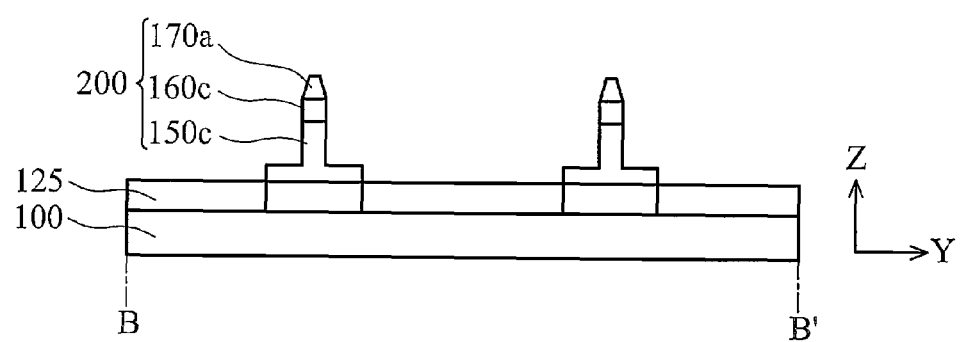

Next, referring to FIGS. 1g and 3f, an etching is optionally performed to the hardmask layers 170a/conductive layer 160b/phase-change material layer 150b stack 200 to straighten the profile and tune the height of phase-change material pedestal if desired. In the etching step, the hardmask layer 170a serves as etching mask with chlorine-based etchant. Further, the etching method can be dry etching if the hardmask layer 170a has sufficient thickness. It should be noted that the hardmask layer 170a is patterned by photolithography process and trimmed by trimming process such as a dry trimming process or solution trimming process, resulting in a photoresist pattern with a width less than the resolution limit of the photolithography process. Then, the conductive layer 160b and phase-change material layer 150b are etched with the reduced hardmask layer 170a as a mask, obtaining conductive layer 160c and phase-change material layer 150c with reduced width W2. After etching, referring to FIG. 1g, the conductive layer 160c comprises a plurality of bit lines.

Figure 3G:
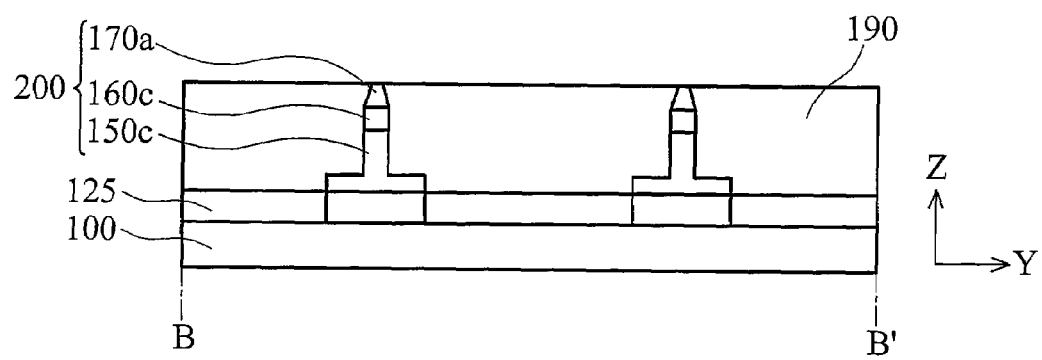

Finally, referring to FIG. 3g, a second dielectric layer 190 is formed on the substrate 100 to fill the trench 140 around the phase-change material layer 150c, in preparation for continued backed-end processing.

Accordingly, in the embodiments of the invention, there is no additional bottom electrode contact with the phase-change material layer in the structure of the phase-change memory element, thereby saving a round of difficult lithographic processing. Furthermore, the critical lithography steps are all based on defining lines and spaces. This enables more aggressive and flexible scaling. Moreover, the top portion of the phase-change material layer 150c can have a diameter less than the resolution limit of photolithography process. The crystallization time is minimized due to very good heating uniformity in the small volume between the bit lines and bottom pedestal of the phase-change material layer. As a result, an operation current and duration for a state conversion of the phase-change material layer may be reduced so as to decrease power dissipation of the phase-change memory element.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a phase-change memory element, comprising: forming a patterned hardmask layer with a first width on a phase-change material layer; etching the phase-change material layer using the patterned hardmask layer with first width as mask; trimming the patterned hardmask layer until a second width of the patterned hardmask layer is achieved, obtaining a tapered profile hardmask layer/phase-change material layer stack with a bottom phase-change material pedestal; and etching the tapered profile hardmask layer/phase-change material layer stack using the patterned hardmask layer with the second width as mask, obtaining a straight profile hardmask layer/phase-change material layer stack with the bottom phase-change material pedestal.

2. The method as claimed in claim 1, before forming a patterned hardmask layer, further comprising:
  providing a dielectric layer with a trench passing therethrough on a substrate; and
  forming the phase-change material layer on the dielectric layer that completely fills the trench.

3. The method as claimed in claim 2, wherein the patterned hardmask layer is perpendicular to the trench.

4. The method as claimed in claim 2, wherein the height of the phase-change material layer disposed in the trench is larger than depth of the trench.

5. The method as claimed in claim 1, wherein the patterned hardmask layer is trimmed by dry trimming process or solution trimming process.

6. The method as claimed in claim 2, wherein the trench has a depth between 20~150 nm.

7. The method as claimed in claim 1, wherein the bottom phase-change material pedestal has the first width.

8. A method of fabricating a phase-change memory element, comprising:
  providing a substrate with a transistor;
  forming a dielectric layer on the substrate;
  forming a trench passing through the dielectric layer to expose one terminal of the transistor;
  forming a phase-change material layer on the dielectric layer that completely fills the trench;
  forming a conductive layer on the phase-change material layer;
  forming a patterned hardmask layer with first width on the conductive layer, wherein the patterned hardmask layer is perpendicular to the trench;
  etching the phase-change material layer and the conductive layer using the patterned hardmask layer with first width as mask;
  trimming the patterned hardmask layer until a second width of the patterned hardmask layer is achieved, obtaining a tapered profile hardmask layer/conductive layer/phase-change material layer stack with a bottom phase-change material pedestal; and
  etching the tapered profile hardmask layer/conductive layer/phase-change material layer stack using the patterned hardmask layer with the second width as mask, obtaining a straight profile hardmask layer/conductive layer/phase-change material layer stack with the bottom phase-change material pedestal.

9. The method as claimed in claim 8, in the step of etching the tapered profile hardmask layer/conductive layer/phase-change material layer stack using the patterned hardmask layer as mask, wherein the remaining conductive layer serves as a bit line.

10. The method as claimed in claim 8 in the step of forming a phase-change material layer on the dielectric layer and completely fill the trench, wherein the height of the phase-change material layer disposed in the trench is larger than depth of the trench.

11. The method as claimed in claim 8 further comprising:
  where the dielectric layer is covered by a protective layer prior to forming the trench.

12. The method as claimed in claim 8, wherein the patterned hardmask layer is trimmed by dry trimming process or solution trimming process.

13. The method as claimed in claim 8, wherein the trench has a depth between 20~150 nm.

14. The method as claimed in claim 8, wherein the trench is parallel to a line comprising a gate or base electrode.

15. The method as claimed in claim 8, wherein only the conductive layer is completely etched to second width defined by patterned hardmask.

16. The method as claimed in claim 8, wherein the bottom phase-change material pedestal has the first width.

* * * * *